United States Patent
Hwu et al.

(10) Patent No.: US 8,247,969 B2
(45) Date of Patent: Aug. 21, 2012

(54) OPTICAL LENS HAVING FLUORESCENT LAYER ADAPTED FOR LED PACKAGING STRUCTURE

(75) Inventors: Jon-Fwu Hwu, Hsinchu (TW); Yung-Fu Wu, Hsinchu (TW); Kui-Chiang Liu, Hsinchu (TW)

(73) Assignee: Gem Weltronics TWN Corporation, Hsinchu County (TW)

( * ) Notice: Subject to any disclaimer, the term of this patent is extended or adjusted under 35 U.S.C. 154(b) by 18 days.

(21) Appl. No.: 12/892,893

(22) Filed: Sep. 28, 2010

(65) Prior Publication Data
US 2012/0074837 A1 Mar. 29, 2012

(51) Int. Cl.
*H05B 33/04* (2006.01)
*H01L 33/10* (2010.01)
(52) U.S. Cl. ............ 313/512; 313/501; 257/99; 257/100
(58) Field of Classification Search .......... 313/501–503, 313/512; 257/99, 100
See application file for complete search history.

(56) References Cited

U.S. PATENT DOCUMENTS

| 6,936,857 B2* | 8/2005 | Doxsee et al. ................... 257/89 |
| 6,982,523 B2* | 1/2006 | Odaki ............................ 313/503 |
| 2004/0145289 A1* | 7/2004 | Ouderkirk et al. ............ 313/113 |
| 2007/0262714 A1* | 11/2007 | Bylsma .......................... 313/512 |
| 2008/0128679 A1* | 6/2008 | Tian et al. ....................... 257/14 |
| 2010/0207512 A1* | 8/2010 | Miyagawa et al. ............ 313/503 |

* cited by examiner

*Primary Examiner* — Karabi Guharay
(74) *Attorney, Agent, or Firm* — Lin & Associates IP, Inc.

(57) ABSTRACT

An optical lens having a fluorescent layer is provided. The optical lens is adapted for being employed in an LED packaging structure. The optical lens includes a substrate, at least one lens body, a lens shade, and a packaging member. The substrate is positioned at a bottommost side of the packaging structure, and the lens shade is positioned at a topmost side of the packaging structure. The lens body is positioned over the substrate and beneath the lens shade. A plurality of light emitting units are disposed on the substrate. The packaging member is adapted for packaging the substrate and the lens shade. The lens body is secured by the packing member so as to be positioned over the light emitting units. The lens body includes a fluorescent layer buried inside the lens body, and the lens body is positioned apart from the light emitting units for a certain distance.

5 Claims, 8 Drawing Sheets

OPTICAL LENS HAVING FLUORESCENT LAYER ADAPTED FOR LED PACKAGING STRUCTURE

BACKGROUND OF THE INVENTION

1. Field of the Invention

The present invention relates generally to an optical lens having a fluorescent layer, which is adapted for being employed in an LED packaging structure, and more particularly, to an optical lens employed in an LED packaging structure, in that the optical lens includes a fluorescent layer buried inside the optical lens and facilitates heat dissipation, and provides a light mixing and guiding function.

2. The Prior Arts

LEDs are known as solid state semiconductor devices. When electrical current flows through a semiconductor PN junction of an LED, the energy carried by two kinds of carriers are converted into a light form and released thereby. LEDs typically have the advantages including light weight, fast responding speed, and high efficiency, and are thus widely applied in a variety of industries.

Referring to FIG. 1, it is a cross-sectional view of a conventional multi-layer LED packaging structure. The multi-layer LED packaging structure includes a substrate 10, a molded platform 12, a lead frame 14, and a mantle 16. The substrate 10 is positioned at the bottom, and the molded platform 12 is adapted for integrating the substrate 10 with the lead frame 14. A plurality of LED dice 18 are arranged in an array form on the substrate 10. The substrate 10 is made of a metal material. The LED dice 18 are electrically connected with the lead frame 14. The mantle 16 and the molded platform 12 are correspondingly coupled to define a sealed inner space. An insulation protection layer 20 is formed covering the LED dice 18. A fluorescent layer 22 is formed on the insulation protection layer 20.

However, the fluorescent layer 22 disposed over the LED dice 18 is directly illuminated by the light emitted from the LED dice 18, and directly absorbs heat generated by the LED dice 18 when emitting light. Unfortunately, ordinary fluorescent layer is usually featured with a low heat-resistance temperature and a poor thermostability. When the heat generated by the LED dice 18 is transmitted to the fluorescent layer 22, the fluorescent layer 22 might be degraded with a lowered light emitting efficiency and an affected photochromism. Further, the fluorescent layer 22 is usually configured on the LED dice 18 by an injection process or a coating process, which requires using excessive fluorescent material for assuring that all of the LED dice 18 are uniformly covered by the fluorescent layer 18. However, such a method unavoidably wastes raw materials. Further, if the fluorescent layer is defective, the LED dice 18 cannot be recycled for reuse. Moreover, according to the conventional technology, optical tests can be conducted only after the fluorescent layer processing. As such, it is desired to provide an LED packaging structure for solving all of the foregoing shortcomings.

SUMMARY OF THE INVENTION

Accordingly, a primary objective of the present invention is to provide an optical lens having a fluorescent layer, which is adapted for being employed in an LED packaging structure. The lens body can be individually pre-formed. The optical lens includes a fluorescent layer buried therein. Prior to being assembled to the LED packaging structure, the lens body can be tested with a variety of optical tests. Only when the lens body is approved to be acceptable for being assembled to the LED packaging structure in accordance with the result of the optical tests, it can be assembled thereby. Further, the lens body can be adaptively designed in accordance with different desired applications. In such a way, the manufacture process of the optical lens can be shortened, and the optical lens can also be provided with light mixing and guiding functions for satisfying different objective.

Another objective of the present invention is to provide an optical lens having a fluorescent layer, which is adapted for being employed in an LED packaging structure. The optical lens is structurally adapted for facilitating the heat dissipation of the LED packaging structure. Specifically, the optical lens includes a fluorescent layer buried therein, and the LED packaging structure includes a plurality of light emitting units. The optical lens is positioned apart away from the light emitting units for a certain distance, thus allowing to directly dissipate the heat generated by the light emitting units to the ambient air. Therefore, the fluorescent layer won't be overheated, and the quality of the fluorescent layer can be maintained and the lifespan thereof can be prolonged.

A still further objective of the present invention is to provide an optical lens having a fluorescent layer, which is adapted for being employed in an LED packaging structure. The amount of fluorescent material employed for preparing the fluorescent layer can be controlled in accordance with the quantity of such optical lenses to be configured. Further, the optical lens is individually pre-formed, and is independent from the light emitting units. In such a way, the cost of fluorescent material can be saved, and the LED dice can be more effectively utilized.

For achieving the foregoing objective and others, the present invention provides an optical lens having a fluorescent layer, which is adapted for being employed in an LED packaging structure. The optical lens includes a substrate, at least one lens body, a lens shade, and a packaging member. The substrate is positioned at a bottommost side of the packaging structure, and the lens shade is positioned at a topmost side of the packaging structure. The lens body is positioned over the substrate and beneath the lens shade. A plurality of light emitting units are disposed on the substrate. The packaging member is adapted for packaging the substrate and the lens shade. The lens body is secured by the packing member so as to be positioned over the light emitting units. The lens body includes a fluorescent layer buried inside the lens body, and the lens body is positioned apart from the light emitting units for a certain distance.

BRIEF DESCRIPTION OF THE DRAWINGS

The present invention will be apparent to those skilled in the art by reading the following detailed description of preferred embodiments thereof, with reference to the attached drawings, in which.

DETAILED DESCRIPTION OF THE PREFERRED EMBODIMENT

Figure 1:
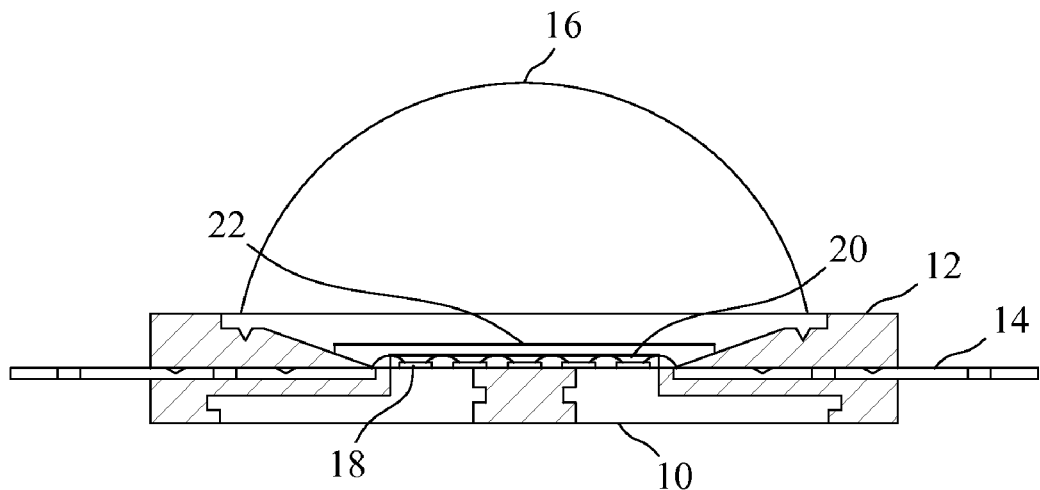
FIG. 1 is a cross-sectional view of a conventional multi-layer LED packaging structure.

The accompanying drawings are included to provide a further understanding of the invention, and are incorporated in and constitute a part of this specification. The drawing illustrates embodiments of the invention and, together with the description, serves to explain the principles of the invention.

Figure 2:
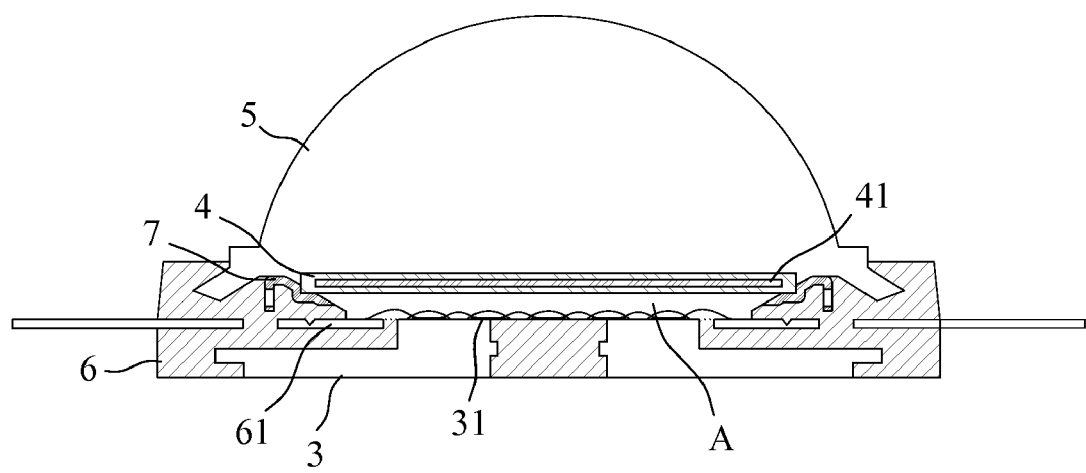
FIG. 2 is a cross-sectional view of an optical lens having a fluorescent layer adapted for being employed in an LED packaging structure according to an embodiment of the present invention.

FIG. 2 is a cross-sectional view of an optical lens having a fluorescent layer adapted for being employed in an LED packaging structure according to an embodiment of the present invention. Referring to FIG. 2, the optical lens includes a substrate 3, at least one lens body 4, a lens shade 5, and a packaging member 6. The substrate 3 is positioned at a bottommost side of the packaging structure, and the lens shade 5 is positioned at a topmost side of the packaging structure. The lens body 4 is positioned over the substrate 3 and beneath the lens shade 5. The substrate 3 includes a plurality of light emitting units 31 disposed thereon. The light emitting units 31 are arranged in an array form on the substrate 3. The packaging member 6 includes two lead frames encapsulated inside the packaging member 6. Preferably, the light emitting units 31 are electrically coupled with the two lead frames of the packaging member 6 by wire bonding. Preferably, the light emitting units 31 are light emitting diode (LED) dice.

The lens body 4 is secured by the packing member 6 so as to be positioned over the light emitting units 31. The lens body 4 is not in contact with the light emitting units 31. On the contrary, the lens body 4 is positioned apart from the light emitting units 31 for a certain distance. The light emitting units 31 and the lens body 4 encircle a space defined as a heat-dissipation space A. According to the embodiment of the present invention, when the light emitting units 31 emit light, the heat generated by the light emitting units 31 is dissipated to the heat-dissipation space A, thus preventing the heat from being conducted to the lens body 4. In such a way, the light emitting efficiency of the light emitting units 31 can be improved, and the lifespan thereof can be prolonged. The lens body 4 can be configured with a rectangular shape, a round shape, an elliptical shape, or a polygonal shape.

The lens body 4 includes a fluorescent layer 41 buried inside the lens body 4. The provision of the fluorescent layer 41 helps providing a light mixing function. The lens body 4 has an upper surface and a bottom surface. The upper surface of the lens body 4 can be formed as a flat surface, a concave surface, a convex surface, or other shapes. The bottom surface of the lens body 4 can be formed as a flat surface, a concave surface, a convex surface, or other shapes. Specifically, the lens body 4 can be preformed prior to assembling to the packaging structure, and the shape of the lens body can be varied in accordance with the desired optical design.

For example, in accordance with the first embodiment of the present invention, the lens body 4 is a flat panel shaped lens. Both of the upper surface and bottom surface of the lens body 41 are flat surfaces. Therefore, light incident thereon can be emitted therethrough and projected therefrom. Facilitated by the fluorescent layer 41, the light can be uniformed and mixed thereby. Further, since the lens body 4 is independently preformed, it can be tested with a variety of optical tests including wavelength and other tests prior to assembling the lens body to the packaging structure. Therefore, the amount of fluorescent material used for preparing the fluorescent layer 41 can be preciously controlled, and waste of the fluorescent material can be prevented.

According to an aspect of the embodiment, the lens body 4 is pre-formed by a blowing process to obtain a configuration having an intermediate vacant layer. Fluorescent material is filled in the intermediate vacant layer of the lens body 4 to configure a fluorescent layer therein. According to another aspect of the embodiment, the lens body 4 is pre-formed by a blowing process to configure the lens body 4 at the peripheral side of the fluorescent material thus encircling the fluorescent material thereby. The fluorescent material is thus taken as a fluorescent layer 41 buried inside the preformed lens body 4. However, it should be noted that the flat plate shaped lens body as exemplified in the first embodiment is for the purpose of illustration without restricting the scope of the present invention.

The packaging member 6 is adapted for packaging the substrate 3 and the lens shade 5. The lens body 4 is disposed between the light emitting units 31 and the lens shade 5. As discussed above, the lens body 4 is secured by the packaging member 6 to be positioned over the light emitting units 31. Or alternatively, the optical lens further includes a reflective cover 7 secured to an inner surface of the packaging member 6 for reflecting the light emitted from the light emitting units 31. The reflective cover 7 also serves to support the lens body 4 in position. The lens body 4 can be secured on the reflective cover 7. Preferably, the reflective cover 7 is configured with a recessive slot, and the lens body 4 can be stably secured in the recessive slot of the reflective cover 7. As can be seen from FIG. 2, the reflective cover 7 has a slanted surface and the recessive slot is configured on the slanted surface so that the lens body 4 can be supported by the recessive slot.

Figure 3:
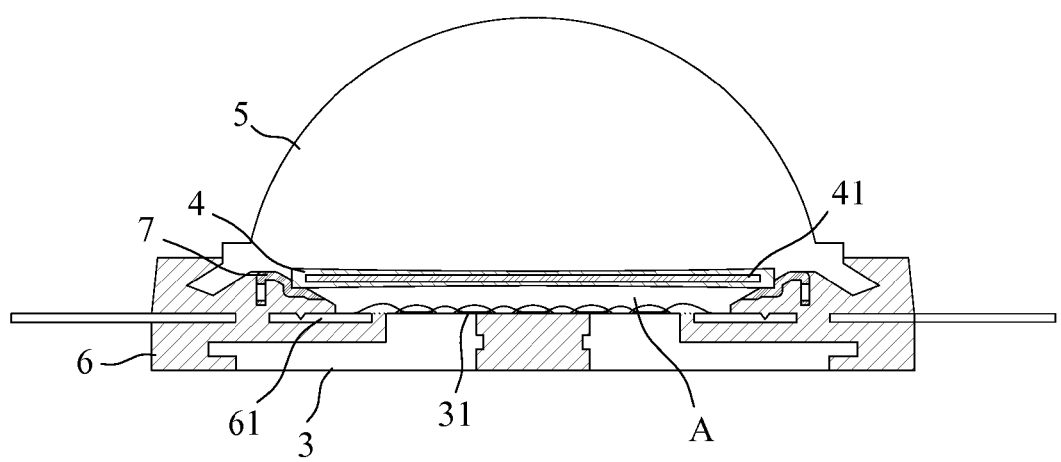
FIG. 3 illustrates an embodiment of the optical lens having a fluorescent layer being employed in an LED packaging structure.
Figure 4:
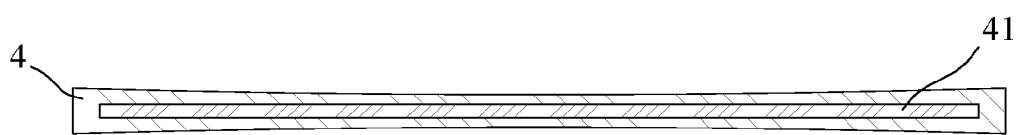
FIG. 4 is a partial enlargement view showing more details of the optical lens of FIG. 3.

FIG. 3 illustrates an embodiment of the optical lens having a fluorescent layer being employed in an LED packaging structure. FIG. 4 is a partial enlargement view showing more details of the optical lens of FIG. 3. Referring to FIGS. 3 and 4, it can be seen that the lens body 4 is configured as a concave lens, in which both of the upper surface and the bottom surface of the lens body 4 are concave surfaces. The concave lens is adapted for diverging the light emitted from the light emitting units 31. In such a way, the output of the light emitted from the light emitting unit 31 can be controlled. When further facilitated with the fluorescent layer 41, light of desired color or wavelength can be obtained.

Figure 5:
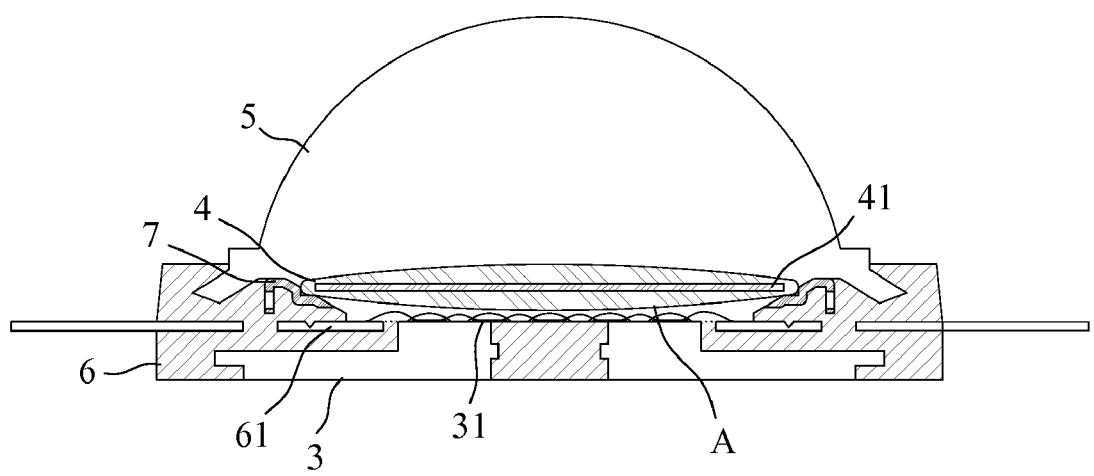
FIG. 5 illustrates another embodiment of the optical lens having a fluorescent layer being employed in an LED packaging structure.
Figure 6:
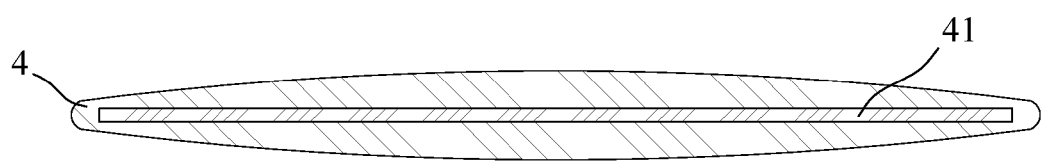
FIG. 6 is a partial enlargement view showing more details of the optical lens of FIG. 5.

FIG. 5 illustrates another embodiment of the optical lens having a fluorescent layer being employed in an LED packaging structure. FIG. 6 is a partial enlargement view showing more details of the optical lens of FIG. 5. Referring to FIGS. 5 and 6, it can be seen that the lens body 4 is configured as a convex lens, in which both of the upper surface and the bottom surface of the lens body 4 are convex surfaces. The convex lens is adapted for converging the light emitted from the light emitting units 31. In such a way, the output of the light emitted from the light emitting unit 31 can be controlled. When further facilitated with the fluorescent layer 41, light of desired color or wavelength can be obtained.

Figure 7:
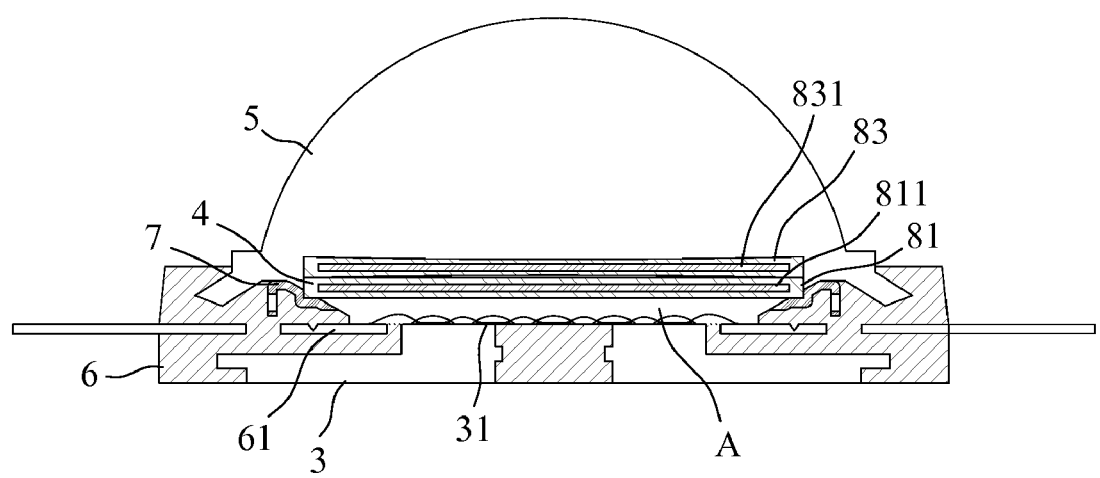
FIG. 7 illustrates a further embodiment of the optical lens having a fluorescent layer being employed in an LED packaging structure.
Figure 8:
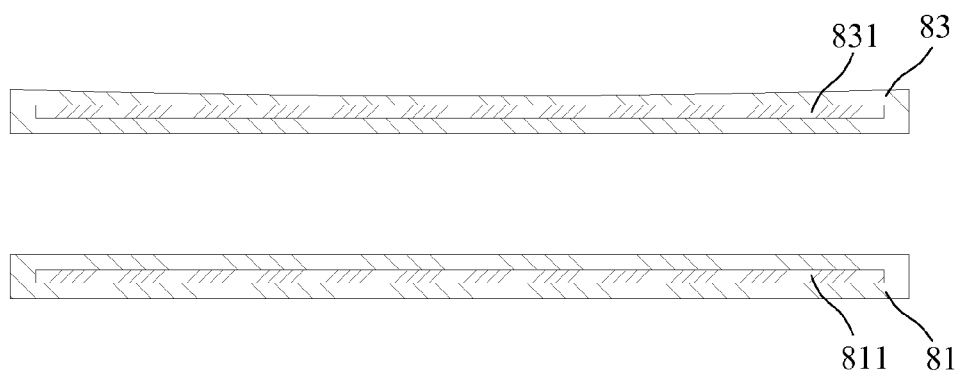
FIG. 8 is a partial enlargement view showing more details of the optical lens of FIG. 7.

FIG. 7 illustrates a further embodiment of the optical lens having a fluorescent layer being employed in an LED pack aging structure. FIG. 8 is a partial enlargement view showing more details of the optical lens of FIG. 7. Referring to FIGS. 7 and 8, the optical lens includes a first lens body 81 and a second lens body 83. The first lens body 81 has an upper surface and a bottom surface, and a first fluorescent layer 811 buried inside the first lens body 81 between the upper surface and the bottom surface. Both of the upper surface and the bottom surface of the first lens body 81 are flat surfaces. The second lens body 83 has an upper surface and a bottom surface, and a second fluorescent layer 831 buried inside the first lens body 81 between the upper surface and the bottom surface. The bottom surface of the second lens body 83 is a flat surface and the upper surface of the second lens body 83 is a concave surface. The first lens body 81 is secured on an inner surface of the reflective cover 7, and the second lens body 83 is laminated on the first lens body 81. The second lens body 83 is positioned beneath the lens shade 5. In accordance with the practical use, the fluorescent materials used for the first fluorescent layer 811 and the second fluorescent layer 831 may be same or different for achieving the desired light color. The shapes of the first lens body 81 and the second lens body 83 are also selectively adapted for achieving the desired light output performance. It should be further noted that although two lens bodies (i.e., the first lens body 81 and the second lens body 83) are exemplified in the present embodiment, the quantity of the lens body 4 is not to be restricted by the present invention.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A packaging structure for light emitting units, comprising:
   a substrate, positioned at a bottommost side of the packaging structure, wherein the substrate comprises a plurality of light emitting units disposed thereon;
   a lens shade, positioned at an uppermost side of the packaging structure;
   at least one pre-formed optical lens with a fluorescent layer buried inside the optical lens, positioned over the substrate and beneath the lens shade;
   a packaging member having an inner surface; and
   a reflective cover disposed between the optical lens and the packaging member for reflecting light emitted from the light emitting units, the reflective cover being secured on the inner surface of the packaging member and having a slanted surface configured with a recessive slot;
   wherein the optical lens is secured in the recessive slot of the reflective cover and supported by the reflective cover to maintain a certain distance to the light emitting units for not being in contact with the light emitting units.

2. The packaging structure as claimed in claim 1, wherein the light emitting units are light emitting diode (LED) dice.

3. The packaging structure as claimed in claim 1, wherein the light emitting units are arranged in an array form on the substrate.

4. The packaging structure as claimed in claim 1, wherein the optical lens has an upper surface, and the upper surface is a flat surface, a convex surface, or a concave surface.

5. The packaging structure as claimed in claim 1, wherein the optical lens has a bottom surface, and the bottom surface is a flat surface, a convex surface, or a concave surface.

* * * * *